US011908517B2

(12) United States Patent
Hung

(10) Patent No.: US 11,908,517 B2
(45) Date of Patent: Feb. 20, 2024

(54) MEMORY DEVICE AND METHOD FOR OPERATING THE SAME

(71) Applicant: NANYA TECHNOLOGY CORPORATION, New Taipei (TW)

(72) Inventor: Kuo-Chiang Hung, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 310 days.

(21) Appl. No.: 17/452,074

(22) Filed: Oct. 25, 2021

(65) Prior Publication Data
US 2023/0130640 A1    Apr. 27, 2023

(51) Int. Cl.
*G11C 16/04*    (2006.01)
*G11C 13/00*    (2006.01)
*H01C 10/16*    (2006.01)

(52) U.S. Cl.
CPC ........ *G11C 13/004* (2013.01); *G11C 13/0038* (2013.01); *G11C 13/0069* (2013.01); *H01C 10/16* (2013.01)

(58) Field of Classification Search
CPC .............. G11C 13/004; G11C 13/0038; G11C 13/0069
USPC ........................................... 365/148
See application file for complete search history.

(56) References Cited

U.S. PATENT DOCUMENTS

| 2019/0244666 | A1* | 8/2019 | Hsu ...................... G11C 14/009 |
| 2022/0236917 | A1* | 7/2022 | Kang ..................... G11C 5/025 |
| 2023/0130640 | A1* | 4/2023 | Hung ................. G11C 13/0038 365/148 |

* cited by examiner

*Primary Examiner* — Vu A Le
(74) *Attorney, Agent, or Firm* — CKC & Partners Co., LLC

(57) ABSTRACT

A memory device includes a first chip, a second chip and a processor. The second chip is coupled to the first chip at a first node. The second chip includes a first capacitor and a first variable resistor. The first capacitor is coupled to the first node. The first variable resistor is coupled in series with the first capacitor. The processor is coupled to the first node, and is configured to perform a first read operation to the first chip via the first node. A method for operating a memory device is also disclosed herein.

20 Claims, 9 Drawing Sheets

MEMORY DEVICE AND METHOD FOR OPERATING THE SAME

BACKGROUND

Technical Field

The present disclosure relates to a memory device. More particularly, the present disclosure relates to a memory device and a method for operating the memory device.

Description of Related Art

A processor, such as a Central Processing Unit (CPU), is configured to read data from memory chips, such as Dynamic Random Access Memory (DRAM) chips. However, the memory chips may generate noises when the processor performs reading operations to the memory chips. Thus, techniques associated with the development for overcoming the problems described above are important issues in the field.

SUMMARY

The present disclosure provides a memory device. The memory device includes a first chip, a second chip and a processor. The second chip is coupled to the first chip at a first node. The second chip includes a first capacitor and a first variable resistor. The first capacitor is coupled to the first node. The first variable resistor is coupled in series with the first capacitor. The processor is coupled to the first node, and is configured to perform a first read operation to the first chip via the first node.

The present disclosure also provides a method for operating a memory device. The method includes: adjusting a resistance of a first chip to a first resistance, wherein the first chip is coupled to a first node; after the resistance of the first chip is adjusted to the first resistance, writing first data stored in a second chip into a processor via the first node; adjusting the resistance of the first chip to a second resistance lower than the first resistance; and after the resistance of the first chip is adjusted to the second resistance, writing second data stored in the first chip into the processor via the first node.

The present disclosure also provides a memory device. The memory device includes a first chip, a second chip and a processor. The first chip is configured to store first data. The second chip is coupled to the first chip at a first node. The processor is configured to read the first data via the first node, and configured to increase a resistance of the second chip in response to reading the first data via the first node.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
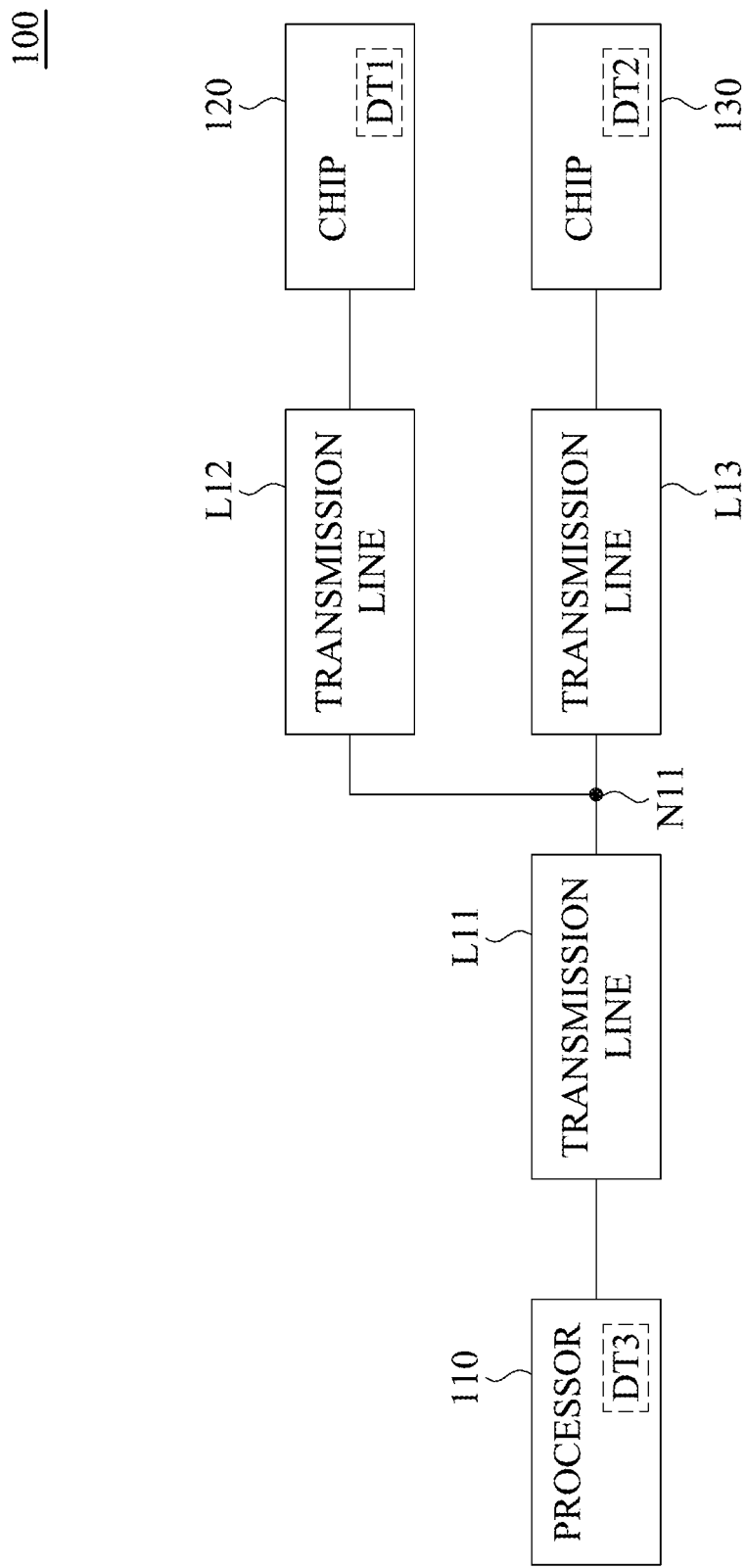
FIG. 1 is a schematic diagram of a memory device illustrated according to some embodiments of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a memory device 100 illustrated according to some embodiments of this disclosure. As illustratively shown in FIG. 1, the memory device 100 includes a processor 110 and chips 120, 130. The processor 110 and chips 120, 130 are coupled to each other at a node N11.

In some embodiments, the processor 110 is implemented as a Central Processing Unit (CPU). In some embodiments, each of the chips 120 and 130 are implemented as a Dynamic Random Access Memory (DRAM) or a die. In some embodiments, the chips 120 and 130 are included in a same package, and are manufactured based on multi-die DRAM packaging technique. In some embodiments, the memory device 100 includes more chips coupled to the node N11 and included in the same package. For example, two chips other than the chips 120 and 130 are coupled to the node N11 and included in the same package with the chips 120 and 130. Such example corresponds to a quad-die packaging (QDP).

In some embodiments, the memory device 100 further includes transmission lines L11-L13. As illustratively shown in FIG. 1, the processor 110 is coupled to the node N11 via the transmission line L11, the chip 120 is coupled to the node N11 via the transmission line L12, and the chip 130 is coupled to the node N11 via the transmission line L13. In various embodiments, various electric elements may be coupled to the transmission lines L11-L13.

In some embodiments, the chip 120 is configured to store data DT1, and the chip 130 is configured to store data DT2. In some embodiments, the chip 120 is configured to transmit the data DT1 to the processor via the transmission line L12, the node N11 and the transmission line L11 in order. In some embodiments, the chip 130 is configured to transmit the data DT2 to the processor via the transmission line L13, the node N11 and the transmission line L11 in order.

In some embodiments, the processor 110 is configured to perform read operations, via the node N11, to the chip 120 and/or the chip 130, to read the corresponding data DT1 and/or DT2. In some embodiments, the processor 110 is configured to adjust a resistance of one of the chips 120 and 130 when performs a reading operation to another one of the chips 120 and 130.

For example, the processor 110 increases a resistance of the chip 120 in response to the processor 110 reading the data DT2 from the chip 130. For another example, the processor 110 increases a resistance of the chip 130 in response to the processor 110 reading the data DT1 from the chip 120. For a further example, the processor 110 decreases resistances of the chips 120 and 130 in response to the processor 110 reading the data DT1 and the data DT2 from the chips 120 and 130 simultaneously. In various embodiments, the processor 110 may adjust the resistances of the chips 120 and 130 in various ways. In some alternative embodiments, the resistances of the chips 120 and 130 may be adjusted by devices other than the processor 110.

In some embodiments, the processor 110 is further configured to store data DT3. In some embodiments, the processor 110 is further configured to perform a writing operation to the chip 120 and/or the chip 130 via the node N11, to write the data DT3 into the chip 120 and/or the chip 130.

Figure 2A:
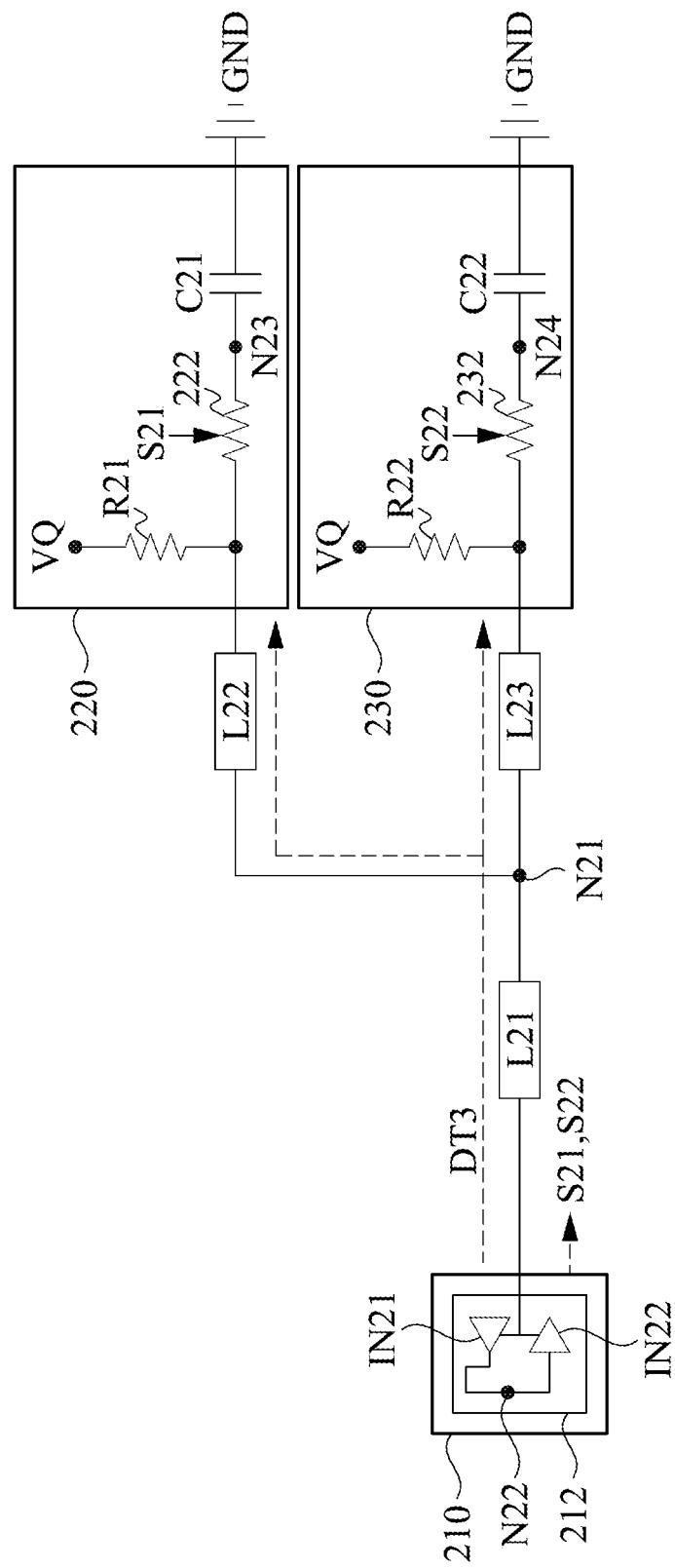
FIG. 2A is a schematic diagram of a memory device illustrated according to some embodiments of this disclosure.

FIG. 2A is a schematic diagram of a memory device 200 illustrated according to some embodiments of this disclosure. As illustratively shown in FIG. 2A, the memory device 200 includes a processor 210, chips 220, 230 and transmission lines L21-L23. The processor 210 and the chips 220, 230 are coupled to each other at a node N21. FIG. 2A corresponds to embodiments that the processor 210 performs a writing operation to the chips 220 and 230, simultaneously. In other words, the chips 220 and 230 are in a write mode.

Referring to FIG. 1 and FIG. 2A, the memory device 200 is an embodiment of the memory device 100. The processor 210, the chips 220, 230 and the transmission lines L21-L23 are correspond to the processor 110, the chips 120, 130 and the transmission lines L11-L13, respectively. Therefore, some descriptions are not repeated for brevity. In some embodiments, each of the transmission lines L21-L23 has a resistance about fifty ohms.

In some embodiments, the processor 210 includes a memory circuit 212 for storing the data DT3. In some embodiments, the memory circuit 212 includes inverters IN21 and IN22. As illustratively shown in FIG. 2A, a terminal of the inverter IN21 is coupled to the node N21, another terminal of the inverter IN21 is coupled to a node N22. A terminal of the inverter IN22 is coupled to the node N21, another terminal of the inverter IN22 is coupled to the inverter IN21 at the node N22. In some embodiments, the inverters IN21 and IN22 are configured to store at least a part of the data DT3 at the node N22. In various embodiments, the processor 210 includes various numbers of memory circuits coupled to the node N21, for storing the data DT3.

In some embodiments, the chip 220 includes a variable resistor 222, a capacitor C21 and a resistor R21. As illustratively shown in FIG. 2A, a terminal of the variable resistor 222 is coupled to the node N21, another terminal of the variable resistor 222 is coupled to the capacitor C21 at a node N23. A terminal of the resistor R21 is coupled to the node N21, another terminal of the resistor R21 is configured to receive a voltage signal VQ. A terminal of the capacitor C21 is coupled to the node N23, another terminal of the capacitor C21 is coupled to a ground GND. In other words, the capacitor C21 and the variable resistor 222 are coupled in series between the ground GND and the node N21.

In some embodiments, the chip 230 includes a variable resistor 232, a capacitor C22 and a resistor R22. As illustratively shown in FIG. 2A, a terminal of the variable resistor 232 is coupled to the node N21, another terminal of the variable resistor 232 is coupled to the capacitor C22 at a node N24. A terminal of the resistor R22 is coupled to the node N21, another terminal of the resistor R22 is configured to receive the voltage signal VQ. A terminal of the capacitor C22 is coupled to the node N24, another terminal of the capacitor C22 is coupled to the ground GND. In other words, the capacitor C22 and the variable resistor 232 are coupled in series between the ground GND and the node N21.

In some embodiments, the capacitors C21 and C22 are referred to as equivalent capacitors of the chips 220 and 230, respectively. In some embodiments, each of the capacitors C21 and C22 has a capacitance about one pico-farad. In some embodiments, each of the resistors R21 and R22 are referred to as an on-die terminal (ODT) resistor. In some embodiments, each of the resistors R21 and R22 is implemented as a variable resistor. In some embodiments, each of the resistors R21 and R22 has a resistance about forty-eight ohms. In some embodiments, the ground GND is referred to as a reference voltage level. In some embodiments, a voltage level of the voltage signal VQ is higher than a voltage level of the ground GND.

In some embodiments, the processor 210 is configured to generate control signals S21 and S22 to control resistances of the chips 220 and 230. In the embodiment shown in FIG. 2A, the processor 210 is configured to adjust a resistance of the variable resistor 222 by the control signal S21, and configured to adjust a resistance of the variable resistor 232 by the control signal S22. For example, in response to the processor 210 writing the data DT3 into the chips 220 and 230, the resistance of the variable resistor 222 is decreased to one ohm by the control signal S21, and/or the resistance of the variable resistor 232 is decreased to one ohm by the control signal S22. In some embodiments, one ohm of the resistances of the variable resistors 222 and 232 do not affect data transmissions.

Figure 2B:
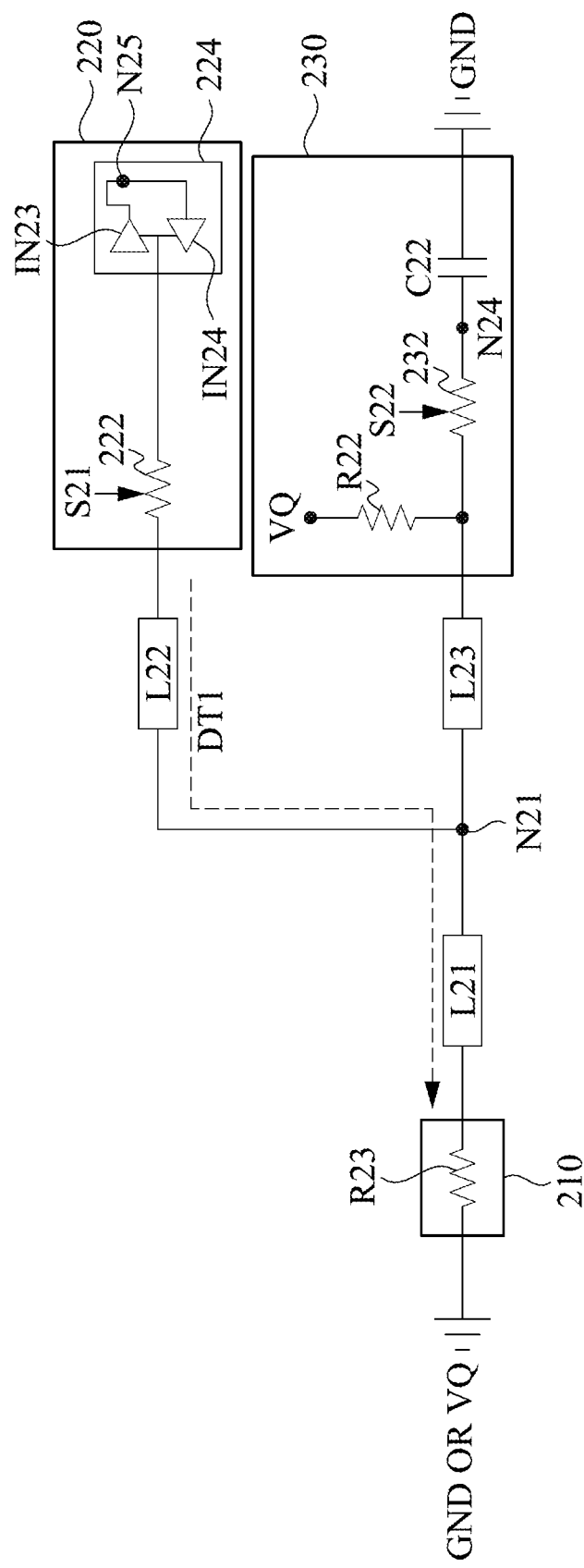
FIG. 2B is a schematic diagram of a memory device illustrated according to some embodiments of this disclosure.

FIG. 2B is a schematic diagram of the memory device 200 illustrated according to some embodiments of this disclosure. FIG. 2B corresponds to embodiments that the processor 210 performs a reading operation to the chip 220 and does not perform a reading operation to the chip 230. In other words, the chip 220 is in a read mode, and the chip 230 is in an idle mode.

In some embodiments, the processor 210 includes a resistor R23. As illustratively shown in FIG. 2B, a terminal of the resistor R23 is coupled to the node N21, another terminal of the resistor R23 is coupled to the ground GND. In some alternative embodiments, the resistor R23 is configured to receive the voltage signal VQ. In some embodiments, the resistor R23 is referred to as an equivalent resistor of the processor 210. In some embodiments, the resistor R23 has a resistance about sixty ohms.

In some embodiments, the chip 220 includes a memory circuit 224 for storing the data DT1. In some embodiments, the memory circuit 224 includes inverters IN23 and IN24. As illustratively shown in FIG. 2B, a terminal of the inverter IN23 is coupled to the variable resistor 222, another terminal of the inverter IN23 is coupled to a node N25. A terminal of the inverter IN24 is coupled to the variable resistor 222, another terminal of the inverter IN24 is coupled to the inverter IN23 at the node N25. In some embodiments, the inverters IN23 and IN24 are configured to store at least a part of the data DT1 at the node N25. In various embodiments, the chip 220 includes various numbers of memory circuits coupled to the variable resistor 222, for storing the data DT1. Referring to FIG. 2A and FIG. 2B, the capacitor C21 is referred to as an equivalent capacitor of the memory circuit 224 in some embodiments.

In some embodiments, in response to the processor 210 performing a reading operation to the chip 220 for reading the data DT1, the processor 210 adjusts the resistance of the variable resistor 222 to a first resistance. In some embodiments, the first resistance is about one ohm.

In some embodiments, in response to the processor 210 performing the reading operation to the chip 220 and not performing a reading operation to the chip 230, the processor 210 adjusts the resistance of the variable resistor 232 to a second resistance larger than the first resistance. In some embodiments, the second resistance is about sixty ohms. In some embodiments, the variable resistor 232 is configured to receive the control signal C22 in response to the processor 210 performing the reading operation to the chip 220 and not performing the reading operation to the chip 230.

As illustratively shown in FIG. 2B, the variable resistors 222 and 232 are coupled in parallel with each other. In some embodiments, when the resistance of the variable resistor 232 is much larger than the resistance of the variable resistor 222, the chip 230 is considered as being open for the node N21. In other words, a current does not flow to the chip 230 via the node N21 when the resistance of the variable resistor 232 is much larger than the resistance of the variable resistor 222.

In some approaches, when a processor reads data from a first chip via a node, current flow to a second chip via the node, such that a capacitor of the second chip generates a reflecting signal which transmits to the processor with a signal of the data via the node and causes noises. As a result, quality of the signal of the data is decreased.

Compared to the above approaches, in some embodiments of the present disclosure, when the processor 210 reads the data DT1 from the chip 220, the resistance of the variable resistor 232 is increased, such that the chip 230 transmits no signal to the node N21. As a result, a signal of the data DT1 transmitted via the node N21 does not be affected by the chip 230, and quality of the signal of the data DT1 is increased.

In some embodiments, in response to the increasing of the resistance of the variable resistor 232, the processor 210 increases the resistance of the resistor R22 to, for example, five thousand ohms.

Figure 2C:
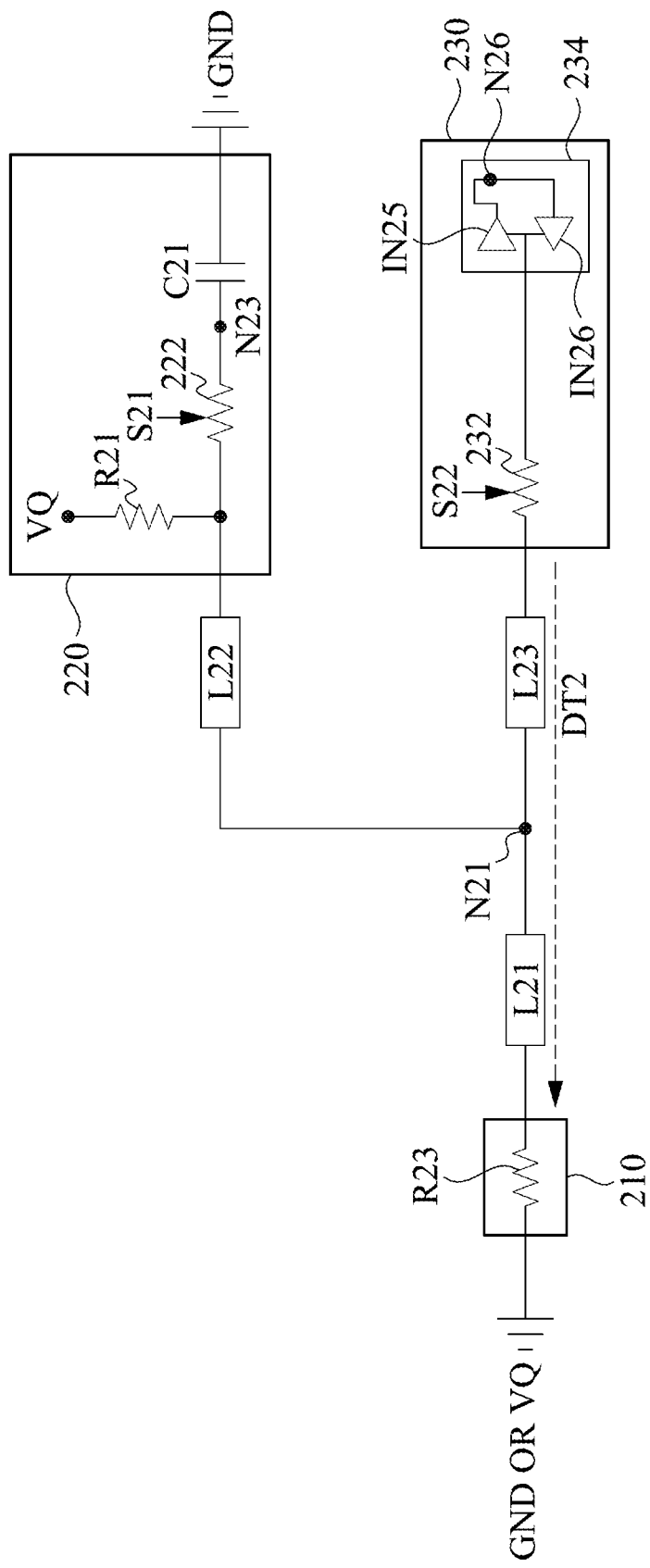
FIG. 2C is a schematic diagram of a memory device illustrated according to some embodiments of this disclosure.

FIG. 2C is a schematic diagram of the memory device 200 illustrated according to some embodiments of this disclosure. FIG. 2C corresponds to embodiments that the processor 210 performs a reading operation to the chip 230 and does not perform a reading operation to the chip 220. In other words, the chip 230 is in the read mode, and the chip 220 is in the idle mode.

In some embodiments, the chip 230 includes a memory circuit 234 for storing the data DT2. In some embodiments, the memory circuit 234 includes inverters IN25 and IN26. As illustratively shown in FIG. 2C, a terminal of the inverter IN25 is coupled to the variable resistor 232, another terminal of the inverter IN25 is coupled to a node N26. A terminal of the inverter IN26 is coupled to the variable resistor 232, another terminal of the inverter IN26 is coupled to the inverter IN25 at the node N26. In some embodiments, the inverters IN25 and IN26 are configured to store at least a part of the data DT2 at the node N26. In various embodiments, the chip 230 includes various numbers of memory circuits coupled to the variable resistor 232, for storing the data DT2. Referring to FIG. 2A and FIG. 2C, the capacitor C22 is referred to as an equivalent capacitor of the memory circuit 234 in some embodiments.

In some embodiments, in response to the processor 210 performing the reading operation to the chip 230 for reading the data DT2, the processor 210 adjusts the resistance of the variable resistor 232 to the first resistance.

In some embodiments, in response to the processor 210 performing a reading operation to the chip 230 and not performing a reading operation to the chip 220, the processor 210 adjusts the resistance of the variable resistor 222 to the second resistance. In some embodiments, the variable resistor 222 is configured to receive the control signal S21 in response to the processor 210 performing the reading operation to the chip 230 and not performing the reading operation to the chip 220.

As illustratively shown in FIG. 2C, the variable resistors 222 and 232 are coupled in parallel with each other. In some embodiments, when the resistance of the variable resistor 222 is much larger than the resistance of the variable resistor 232, the chip 220 is considered as being open for the node N21. In other words, a current does not flow to the chip 220 via the node N21 when the resistance of the variable resistor 222 is much larger than the resistance of the variable resistor 232.

Figure 2D:
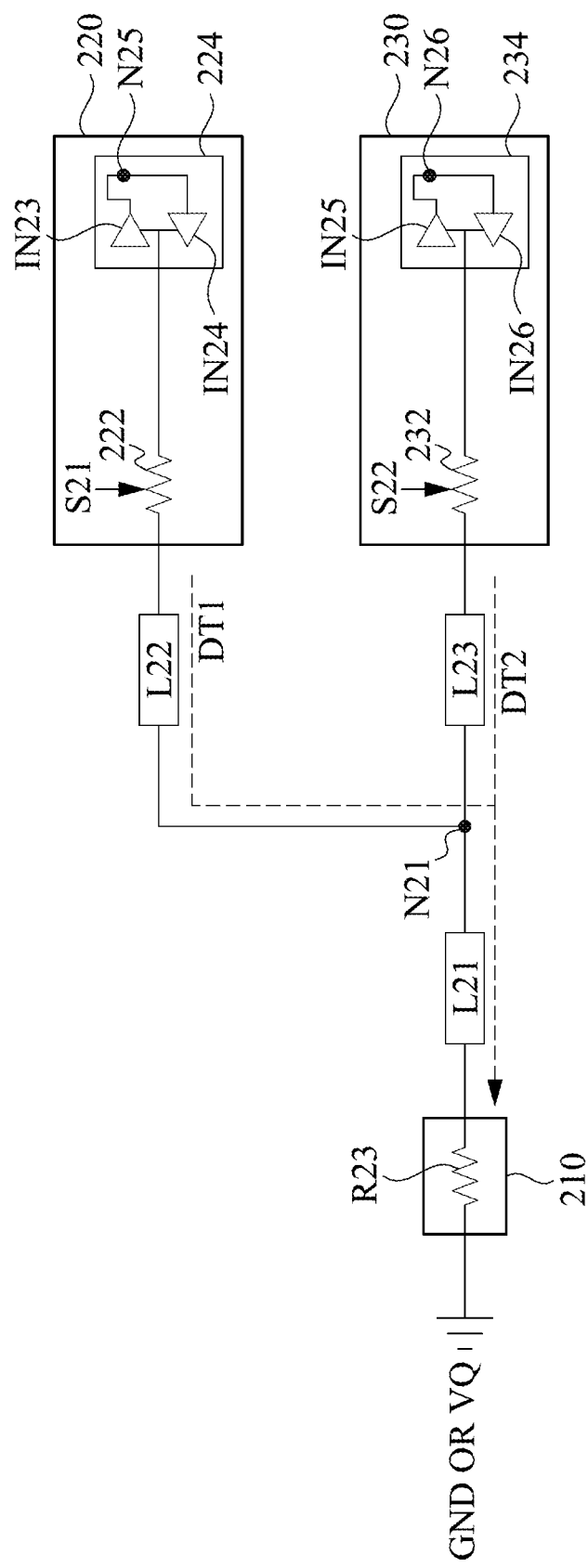
FIG. 2D is a schematic diagram of a memory device illustrated according to some embodiments of this disclosure.

FIG. 2D is a schematic diagram of the memory device 200 illustrated according to some embodiments of this disclosure. FIG. 2D corresponds to embodiments that the processor 210 performs a reading operation to the chips 220 and 230, simultaneously. In other words, the chips 220 and 230 are in the read mode simultaneously.

In some embodiments, in response to the processor 210 performing the reading operation to the chips 220 and 230 for reading the data DT1 and DT2, the processor 210 adjusts each of the resistances of the variable resistors 222 and 232 to the first resistance.

Figure 3A:
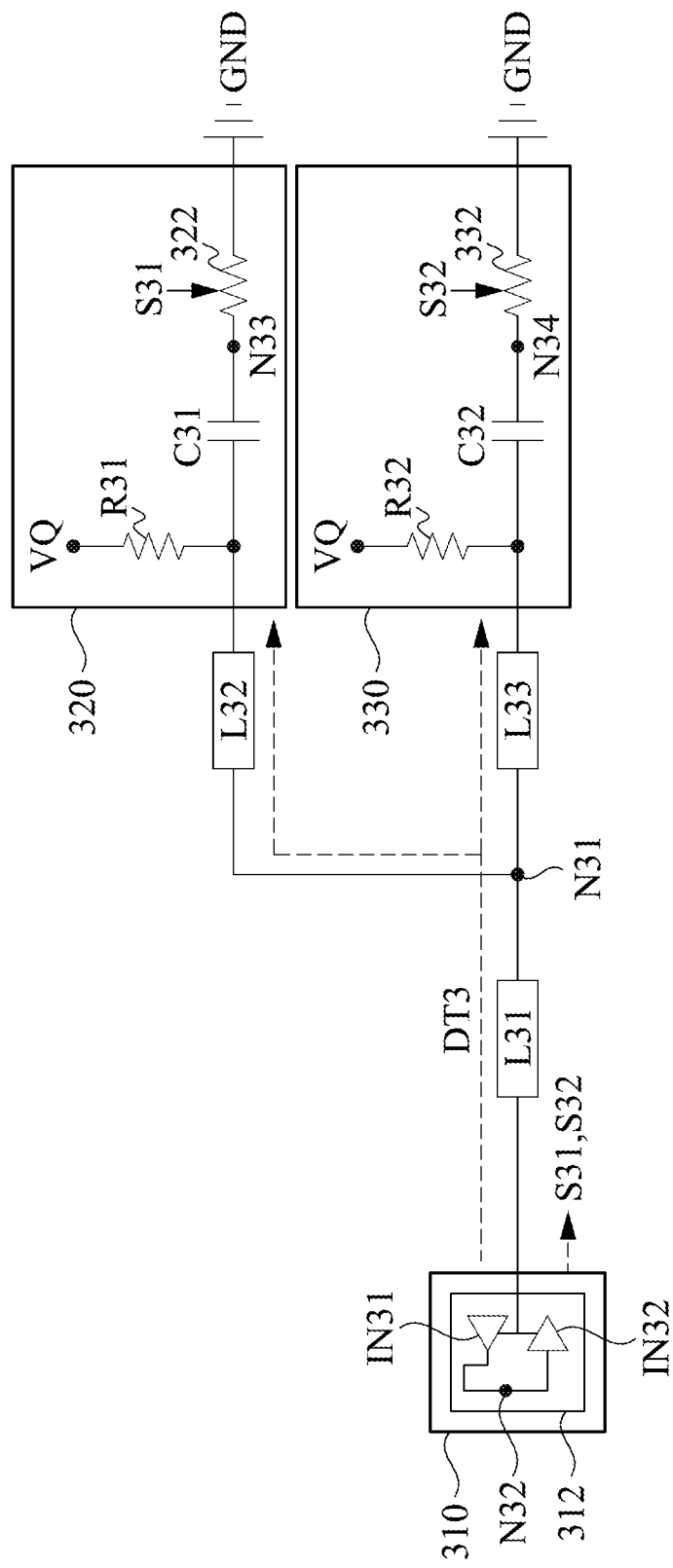
FIG. 3A is a schematic diagram of a memory device illustrated according to some embodiments of this disclosure.

FIG. 3A is a schematic diagram of a memory device 300 illustrated according to some embodiments of this disclosure. As illustratively shown in FIG. 3A, the memory device 300 includes a processor 310, chips 320, 330 and transmission lines L31-L33. The processor 310 and the chips 320, 330 are coupled to each other at a node N31. FIG. 3A corresponds to embodiments that the processor 310 performs a writing operation to the chips 320 and 330 simultaneously. In other words, the chips 320 and 330 are in a write mode.

Referring to FIG. 1 and FIG. 3A, the memory device 300 is an embodiment of the memory device 100. Referring to FIG. 2A and FIG. 3A, the memory device 300 is an alternative embodiment of the memory device 200. The processor 310, the chips 320, 330 and the transmission lines L31-L33 are correspond to the processor 210, the chips 220, 230 and the transmission lines L21-L23, respectively. Therefore, some descriptions are not repeated for brevity.

In some embodiments, the processor 310 includes a memory circuit 312 for storing the data DT3. In some embodiments, the memory circuit 312 includes inverters IN31 and IN32. As illustratively shown in FIG. 3A, a terminal of the inverter IN31 is coupled to the node N31, another terminal of the inverter IN31 is coupled to a node N32. A terminal of the inverter IN32 is coupled to the node N31, another terminal of the inverter IN32 is coupled to the inverter IN31 at the node N32. In some embodiments, the inverters IN31 and IN32 are configured to store at least a part of the data DT3 at the node N32. In various embodiments, the processor 310 includes various numbers of memory circuits coupled to the node N31, for storing the data DT3.

In some embodiments, the chip 320 includes a variable resistor 322, a capacitor C31 and a resistor R31. As illustratively shown in FIG. 3A, a terminal of the variable resistor 322 is coupled to the ground GND, another terminal of the variable resistor 322 is coupled to the capacitor C31 at a node N33. A terminal of the resistor R31 is coupled to the node N31, another terminal of the resistor R31 is configured to receive the voltage signal VQ. A terminal of the capacitor C31 is coupled to the node N33, another terminal of the capacitor C31 is coupled to the node N31. In other words, the capacitor C31 and the variable resistor 322 are coupled in series between the ground GND and the node N31.

In some embodiments, the chip 330 includes a variable resistor 332, a capacitor C32 and a resistor R32. As illustratively shown in FIG. 3A, a terminal of the variable resistor 332 is coupled to the ground GND, another terminal of the variable resistor 332 is coupled to the capacitor C32 at a node N34. A terminal of the resistor R32 is coupled to the node N31, another terminal of the resistor R32 is configured to receive the voltage signal VQ. A terminal of the capacitor C32 is coupled to the node N34, another terminal of the capacitor C33 is coupled to the node N31. In other words, the capacitor C33 and the variable resistor 332 are coupled in series between the ground GND and the node N31.

In some embodiments, the capacitors C31 and C32 are referred to as equivalent capacitors of the chips 320 and 330, respectively. In some embodiments, each of the capacitors C31 and C32 has a capacitance about one pico-farad. In some embodiments, each of the resistors R31 and R32 are referred to as an on-die terminal (ODT) resistor. In some embodiments, each of the resistors R31 and R32 is implemented as a variable resistor. In some embodiments, each of the resistors R31 and R32 has a resistance about forty-eight ohms.

In some embodiments, the processor 310 is configured to generate control signals S31 and S32 to control resistances of the chips 320 and 330. In the embodiment shown in FIG. 3A, the processor 310 is configured to adjust a resistance of the variable resistor 322 by the control signal S31, and configured to adjust a resistance of the variable resistor 332 by the control signal S32. For example, in response to the processor 310 writing the data DT3 into the chips 320 and 330, the resistance of the variable resistor 322 is decreased to one ohm by the control signal S31, and/or the resistance of the variable resistor 332 is decreased to one ohm by the control signal S32. In some embodiments, one ohm of resistances of the variable resistors 322 and 332 do not affect data transmissions.

Figure 3B:
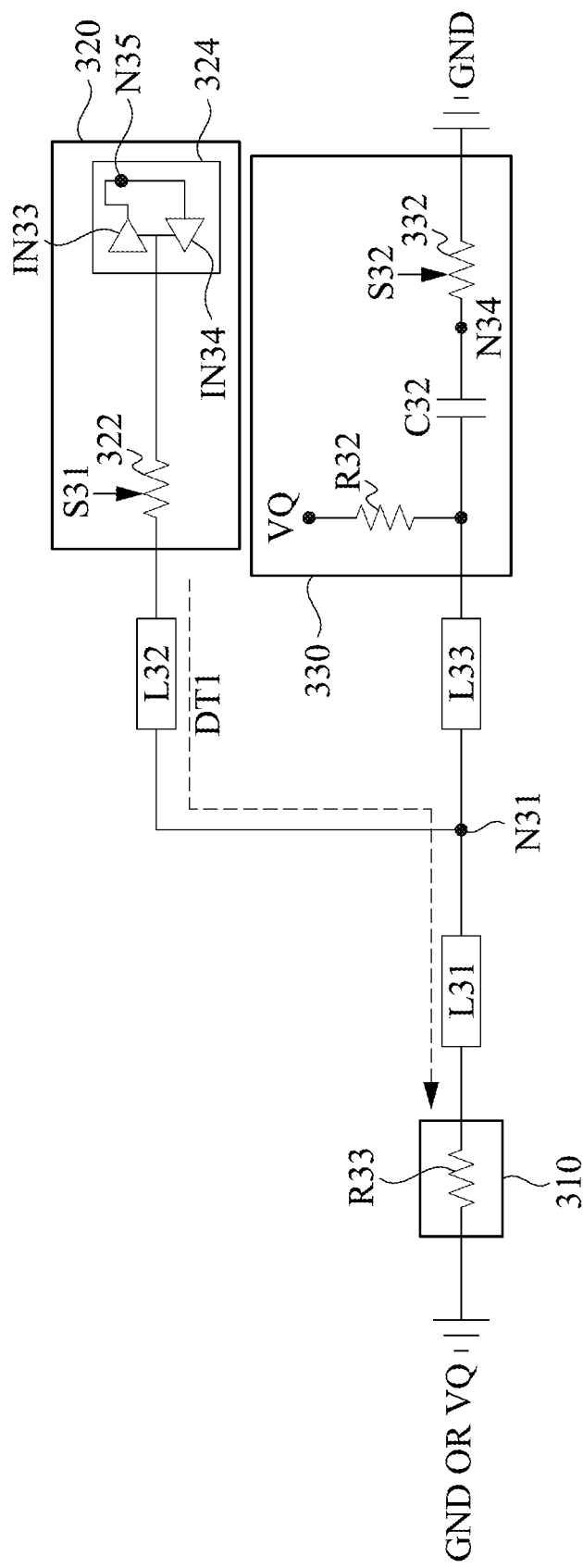
FIG. 3B is a schematic diagram of a memory device illustrated according to some embodiments of this disclosure.

FIG. 3B is a schematic diagram of the memory device 300 illustrated according to some embodiments of this disclosure. FIG. 3B corresponds to embodiments that the processor 310 performs a reading operation to the chip 320 and does not perform a reading operation to the chip 330. In other words, the chip 320 is in a read mode, and the chip 330 is in an idle mode.

In some embodiments, the processor 310 includes a resistor R33. As illustratively shown in FIG. 3B, a terminal of the resistor R33 is coupled to the node N31, another terminal of the resistor R33 is coupled to the ground GND. In some alternative embodiments, the resistor R33 is configured to receive the voltage signal VQ. In some embodiments, the resistor R33 is referred to as an equivalent resistor of the processor 310. In some embodiments, the resistor R33 has a resistance about sixty ohms.

In some embodiments, the chip 320 includes a memory circuit 324 for storing the data DT1. In some embodiments, the memory circuit 324 includes inverters IN33 and IN34.

As illustratively shown in FIG. 3B, a terminal of the inverter IN33 is coupled to the variable resistor 322, another terminal of the inverter IN33 is coupled to a node N35. A terminal of the inverter IN34 is coupled to the variable resistor 322, another terminal of the inverter IN34 is coupled to the inverter IN33 at the node N35. In some embodiments, the inverters IN33 and IN34 are configured to store at least a part of the data DT1 at the node N35. In various embodiments, the chip 330 includes various numbers of memory circuits coupled to the variable resistor 322, for storing the data DT1. Referring to FIG. 3A and FIG. 3B, the capacitor C31 is referred to as an equivalent capacitor of the memory circuit 324 in some embodiments.

In some embodiments, in response to the processor 310 performing a reading operation to the chip 320 for reading the data DT1, the processor 310 adjusts the resistance of the variable resistor 322 to the first resistance. In some embodiments, the variable resistor 332 is configured to receive the control signal S32 in response to the processor 310 performing the reading operation to the chip 320 and not performing the reading operation to the chip 330.

In some embodiments, in response to the processor 310 performing the reading operation to the chip 320 and not performing a reading operation to the chip 330, the processor 310 adjusts the resistance of the variable resistor 332 to the second resistance.

As illustratively shown in FIG. 3B, the variable resistors 322 and 332 are coupled in parallel with each other. In some embodiments, when the resistance of the variable resistor 332 is much larger than the resistance of the variable resistor 322, the chip 330 is considered as being open for the node N31. In other words, a current does not flow to the chip 330 via the node N31 when the resistance of the variable resistor 332 is much larger than the resistance of the variable resistor 322.

In some embodiments, in response to the increasing of the resistance of the variable resistor 332, the processor 310 increases the resistance of the resistor R32 to, for example, five thousand ohms.

Figure 3C:
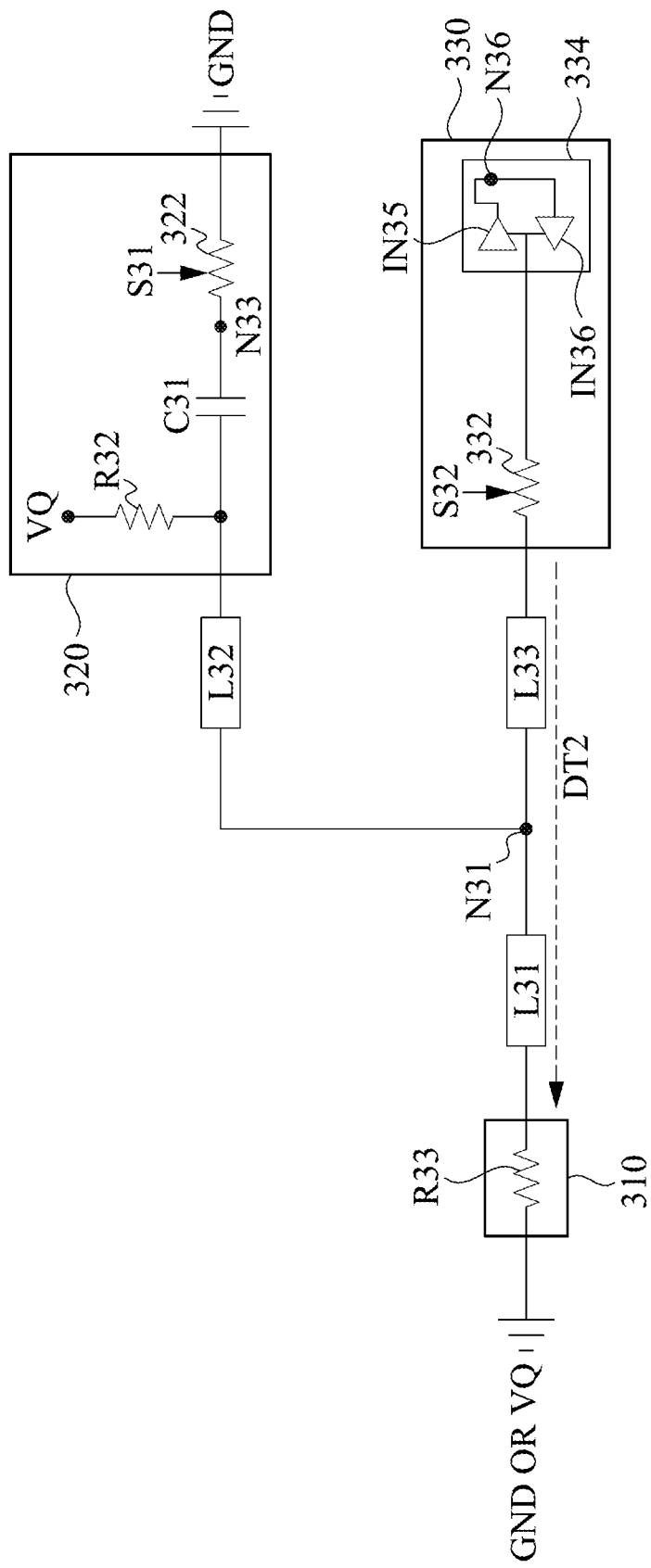
FIG. 3C is a schematic diagram of a memory device illustrated according to some embodiments of this disclosure.

FIG. 3C is a schematic diagram of the memory device 300 illustrated according to some embodiments of this disclosure. FIG. 3C corresponds to embodiments that the processor 310 performs a reading operation to the chip 330 and does not perform a reading operation to the chip 320. In other words, the chip 330 is in the read mode, and the chip 320 is in the idle mode.

In some embodiments, the chip 330 includes a memory circuit 334 for storing the data DT2. In some embodiments, the memory circuit 334 includes inverters IN35 and IN36. As illustratively shown in FIG. 3C, a terminal of the inverter IN35 is coupled to the variable resistor 332, another terminal of the inverter IN35 is coupled to a node N36. A terminal of the inverter IN36 is coupled to the variable resistor 332, another terminal of the inverter IN36 is coupled to the inverter IN35 at the node N36. In some embodiments, the inverters IN35 and IN36 are configured to store at least a part of the data DT2 at the node N36. In various embodiments, the chip 330 includes various numbers of memory circuits coupled to the variable resistor 332, for storing the data DT2. Referring to FIG. 3A and FIG. 3C, the capacitor C32 is referred to as an equivalent capacitor of the memory circuit 334 in some embodiments.

In some embodiments, in response to the processor 310 performing the reading operation to the chip 330 for reading the data DT2, the processor 310 adjusts the resistance of the variable resistor 332 to the first resistance.

In some embodiments, in response to the processor 310 performing a reading operation to the chip 330 and not performing a reading operation to the chip 320, the processor 310 adjusts the resistance of the variable resistor 322 to the second resistance. In some embodiments, the variable resistor 322 is configured to receive the control signal S31 in response to the processor 310 performing the reading operation to the chip 330 and not performing the reading operation to the chip 320.

As illustratively shown in FIG. 3C, the variable resistors 322 and 332 are coupled in parallel with each other. In some embodiments, when the resistance of the variable resistor 322 is much larger than the resistance of the variable resistor 332, the chip 320 is considered as being open for the node N31. In other words, a current does not flow to the chip 320 via the node N31 when the resistance of the variable resistor 322 is much larger than the resistance of the variable resistor 332.

Figure 3D:
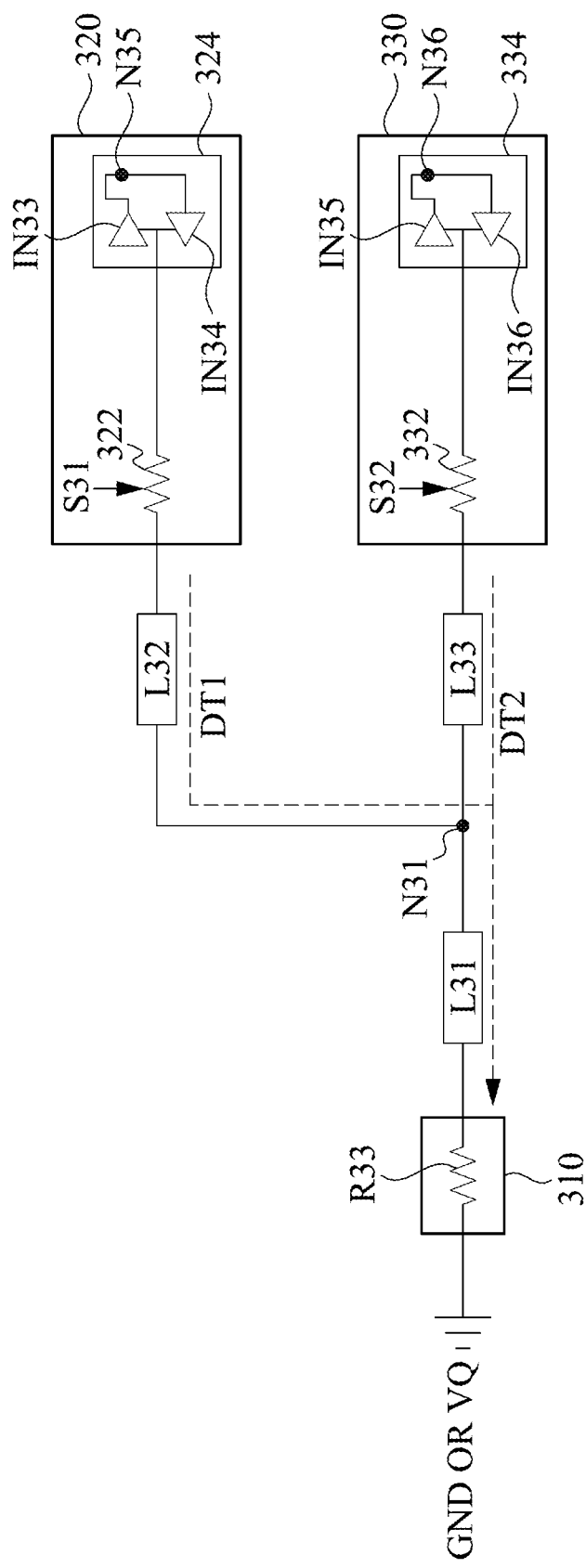
FIG. 3D is a schematic diagram of a memory device illustrated according to some embodiments of this disclosure.

FIG. 3D is a schematic diagram of the memory device 300 illustrated according to some embodiments of this disclosure. FIG. 3D corresponds to embodiments that the processor 310 performs a reading operation to the chips 320 and 330, simultaneously. In other words, the chips 320 and 330 are in the read mode.

In some embodiments, in response to the processor 310 performing the reading operation to the chips 320 and 330 for reading the data DT1 and DT2, the processor 310 adjusts each of the resistances of the variable resistors 322 and 332 to the first resistance.

The present disclosure is not limited to the embodiments described above. Various methods of adjusting the resistance of the chips 120 and 130 in response to reading operations of the processor 110 are contemplated as being within the scope of the present disclosure.

In summary, in the embodiments of the present disclosure, the processor 110 increases the resistance of one of the chips 120 and 130 when processor 110 reads data from another one the chips 120 and 130, to reduce noises from the one of the chips 120 and 130.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
 a first chip;
 a second chip coupled to the first chip at a first node, and comprising:
  a first capacitor coupled to the first node; and
  a first variable resistor coupled in series with the first capacitor; and
 a processor coupled to the first node, and configured to perform a first read operation to the first chip via the first node.

2. The memory device of claim 1, wherein the first variable resistor has a first resistance when the processor performs the first read operation to the first chip, and has a second resistance lower than the first resistance when the processor performs a second read operation to the second chip via the first node.

3. The memory device of claim 1, wherein the processor is further configured generate a control signal to adjust a resistance of the first variable resistor in response to the processor performing the first read operation to the first chip.

4. The memory device of claim 3, wherein the processor is further configured to
in response to the processor performing the first read operation to the first chip, increase the resistance, and
in response to the processor not performing the first read operation to the first chip, decrease the resistance.

5. The memory device of claim 1, wherein the first chip comprises:
a second capacitor coupled to the first node; and
a second variable resistor coupled in series with the first capacitor,
wherein the processor is further configured to increase a resistance of the second variable resistor when the processor performs a second read operation to the second chip.

6. The memory device of claim 5, wherein the processor is further configured to decrease a resistance of the second variable resistor when the processor performs the first read operation to the first chip.

7. The memory device of claim 1, wherein the first capacitor is coupled between the first node and a ground, and
the first variable resistor is coupled between the first capacitor and the first node.

8. The memory device of claim 1, wherein the first capacitor is coupled between the first node and a ground, and
the first variable resistor is coupled between the first capacitor and the ground.

9. A method for operating a memory device, comprising:
adjusting a resistance of a first chip to a first resistance, wherein the first chip is coupled to a first node;
after the resistance of the first chip is adjusted to the first resistance, writing first data stored in a second chip into a processor via the first node;
adjusting the resistance of the first chip to a second resistance lower than the first resistance; and
after the resistance of the first chip is adjusted to the second resistance, writing second data stored in the first chip into the processor via the first node.

10. The method of claim 9, further comprising:
adjusting the resistance of the first chip and the resistance of the second chip to the second resistance; and
after the resistance of the first chip and the resistance of the second chip are adjusted to the second resistance, writing third data stored in the processor into the first chip and the second chip via the first node.

11. The method of claim 9, further comprising:
adjusting the resistance of the first chip and the resistance of the second chip to the second resistance; and
after the resistance of the first chip and the resistance of the second chip are adjusted to the second resistance, writing the first data and the second data into the processor via the first node, simultaneously.

12. The method of claim 9, further comprising:
adjusting a resistance of the second chip to the second resistance when the first data is written into the processor via the first node.

13. The method of claim 12, further comprising:
adjusting the resistance of the second chip to the first resistance when the second data is written into the processor via the first node.

14. The method of claim 9, wherein adjusting the resistance of the first chip comprises:
generating a first control signal by the processor, in response to writing the first data into the processor; and
receiving the first control signal by a first variable resistor in the first chip, to increase a resistance of the first variable resistor.

15. The method of claim 14, wherein adjusting the resistance of the second chip comprises:
generating a second control signal by the processor, in response to writing the second data into the processor; and
receiving the second control signal by a second variable resistor in the second chip, to increase a resistance of the second variable resistor.

16. A memory device, comprising:
a first chip configured to store first data;
a second chip coupled to the first chip at a first node; and
a processor configured to read the first data via the first node, and configured to increase a resistance of the second chip in response to reading the first data via the first node.

17. The memory device of claim 16, wherein the second chip comprises:
a first variable resistor configured to be controlled by the processor; and
a first capacitor coupled in series with the first variable resistor, wherein the first capacitor and the first variable resistor are coupled between the first node and a ground.

18. The memory device of claim 17, wherein the processor is further configured to increase a resistance of the first variable resistor in response to the processor reading the first data.

19. The memory device of claim 16, wherein the second chip is configured to store second data,
the processor is further configured to read the second data via the first node, and configured to increase a resistance of the first chip in response to reading the second data via the first node.

20. The memory device of claim 19, wherein the processor is further configured to decrease the resistance of the second chip and the resistance of the first chip in response to the processor reading the first data and the second data simultaneously.

* * * * *